United States Patent
Browne et al.

(10) Patent No.: US 8,237,459 B2
(45) Date of Patent: Aug. 7, 2012

(54) METHOD OF TESTING GROUND RESISTANCE BY MAKING USE OF EXISTING TELEPHONE LINES

(75) Inventors: Ewan G. Browne, Dallas, TX (US); Wayne Jacob Chappell, Arlington, TX (US); Paul R. Siglinger, Fort Worth, TX (US); William Cory Wood, Fort Worth, TX (US); Edwin Glenn Yancey, Burleson, TX (US)

(73) Assignee: Greenlee Textron Inc., Rockford, IL (US)

( * ) Notice: Subject to any disclaimer, the term of this patent is extended or adjusted under 35 U.S.C. 154(b) by 963 days.

(21) Appl. No.: 12/200,446

(22) Filed: Aug. 28, 2008

(65) Prior Publication Data
US 2009/0058433 A1   Mar. 5, 2009

Related U.S. Application Data (60) Provisional application No. 60/968,399, filed on Aug. 28, 2007.

(51) Int. Cl.
*G01R 27/08* (2006.01)
(52) U.S. Cl. .......................... 324/715; 324/691; 324/724
(58) Field of Classification Search .................. 324/715
See application file for complete search history.

(56) References Cited

U.S. PATENT DOCUMENTS

| | | | |
|---|---|---|---|
| 4,153,923 A | 5/1979 | Graf | |
| 4,186,283 A * | 1/1980 | Simmonds | 379/21 |
| 4,866,391 A | 9/1989 | Latham, Jr. | |
| 5,189,375 A | 2/1993 | Tuttle | |
| 5,302,905 A | 4/1994 | Crick | |
| 5,515,218 A | 5/1996 | DeHaven | |
| 6,396,284 B1 | 5/2002 | Tisdale et al. | |
| 7,057,401 B2 * | 6/2006 | Blades | 324/713 |
| 2007/0288195 A1 * | 12/2007 | Waite et al. | 702/150 |
| 2008/0100282 A1 | 5/2008 | Crick | |

OTHER PUBLICATIONS

NETA, ATS 2003, Inspection and Test Procedures, 7.3.3 Cables, Medium and High Voltage, Dymaxservice Acceptance Cable Test, p. 1-4.*
Crick, U.S. Appl. No. 60/786,996, provisional patent application, Mar. 29, 2006, p. 1-11.*
Crick, U.S. Appl. No. 60/854,285, provisional patent application, Oct. 25, 2006, p. 1-6.*
Galvan Electrical, archived webpage, Nov. 24, 2005, p. 1, www.galvanizersonline.com.*

* cited by examiner

*Primary Examiner* — Thomas Valone
(74) *Attorney, Agent, or Firm* — Clark Hill PLC (57) ABSTRACT

A fall of potential method of determining earth ground resistance which utilizes an earth ground tester and eliminates the need for utilizing removable ground stakes. Rather than utilizing a "far stake" the method provides connection of the earth ground tester to the telephone wires. Rather than utilizing a "near stake" the method provides for connection of the earth ground tester to the cable shield.

12 Claims, 6 Drawing Sheets

METHOD OF TESTING GROUND RESISTANCE BY MAKING USE OF EXISTING TELEPHONE LINES

This application claims the domestic benefit of U.S. Provisional Application Ser. No. 60/968,399, filed on Aug. 28, 2007, which disclosure is hereby incorporated by reference in its entirety.

FIELD OF THE INVENTION

This invention is generally directed to a method of testing/measuring ground resistance which reduces or eliminates the need for placing removable ground stakes.

BACKGROUND OF THE INVENTION

Ground testers are devices used to measure the resistance of earth to a buried ground rod or electrode. Proper grounding is required by many industries and applications and grounding recommendations and practices exist from many organizations, such as NEC (National Electric Code), OSHA, ANSI, TIA (Telecommunications Industry Association), IEEE, as well as others.

Earth grounding is used to provide a connection from electronics and power to earth. Earth grounding provides protection for faults, lighting strikes, RFI, EMI, and other interference. Poor grounding can result in injury or death to people, animals, and plants. It can also result in damage, poor operation, or the failure of equipment and electronics to operate.

DESCRIPTION OF THE PRIOR ART

Current ground testers measure the resistance between the grounding point and earth ground using a fall of potential method. The fall of potential method requires three connections. A first connection is made to the earth ground to be tested, and the second and third connections are made to two stakes placed in the ground some distance from the earth ground to be tested.

In performing this method, the earth ground is disconnected from its typical connection, i.e. the building, equipment, or other devices to which it is normally connected. A first (near) stake is then placed in the ground at a distance from the earth ground. A second (far) stake is placed in the ground beyond the first stake such that the first stake is directly between the earth ground and the second (far) stake. Next, a signal is applied at the second stake with respect to the earth ground. The voltage drop, i.e. "fall of potential" is measured at the first stake with respect to the earth ground. Because a known signal having a known current is applied, the resistance of earth between the first stake and earth ground can be determined. If the ground resistance is not within the allowable range, action can be taken to correct the problem. In order for ground resistance to be accurately measured using this method, proper placement of the first and second stakes is important. For example, it is important that the first stake is sufficiently spaced from the earth ground and the second stake so as not to be influenced by the earth ground and the second stake. A problem, however, may be obtaining access in a straight line from the earth ground being tested and the first and second stakes. In urban areas, for example, pavement, building or other obstructions are often located at the positions where the first and second stakes need to be placed, preventing their placement at appropriate locations. In other instances it may be possible to place the first (near) stake but it is not possible to place the second (far) stake.

SUMMARY OF THE INVENTION

The present invention provides a method of testing ground resistance by making use of telephone lines, which overcomes the problems presented in the prior art and which provides additional advantages over the prior art, such advantages will become clear upon a reading of the attached specification in combination with a study of the drawings.

BRIEF DESCRIPTION OF THE DRAWINGS

The organization and manner of the structure and operation of the invention, together with further objects and advantages thereof, may best be understood by reference to the following description, taken in connection with the accompanying drawings, wherein like reference numerals identify like elements in which.

DETAILED DESCRIPTION OF THE ILLUSTRATED EMBODIMENTS

While the invention may be susceptible to embodiment in different forms, there is shown in the drawings, and herein will be described in detail, specific embodiments with the understanding that the present disclosure is to be considered an exemplification of the principles of the invention, and is not intended to limit the invention to that as illustrated and described herein.

The present invention discloses ground testing methods for use in connection with telephone communication systems and which eliminate the placement of first and second stakes by using existing telephone lines. In a first method, placement of the second (far) stake is eliminated requiring the use of only a single stake. In the second method, placement of the first (near) stake is eliminated and placement of the second (far) stake is eliminated, resulting in a no-stake method.

Figure 1:
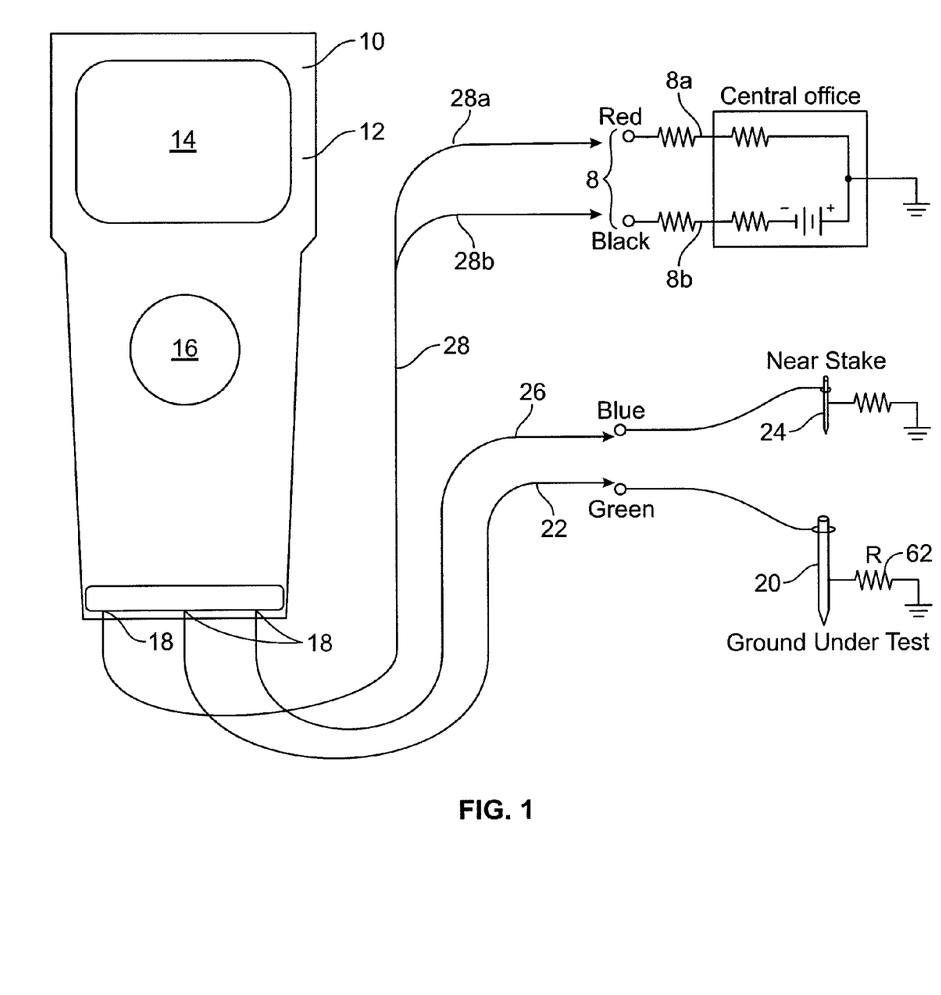
FIG. 1 illustrates connection of a ground resistance tester in accordance with a first method of the present invention.
Figure 2:
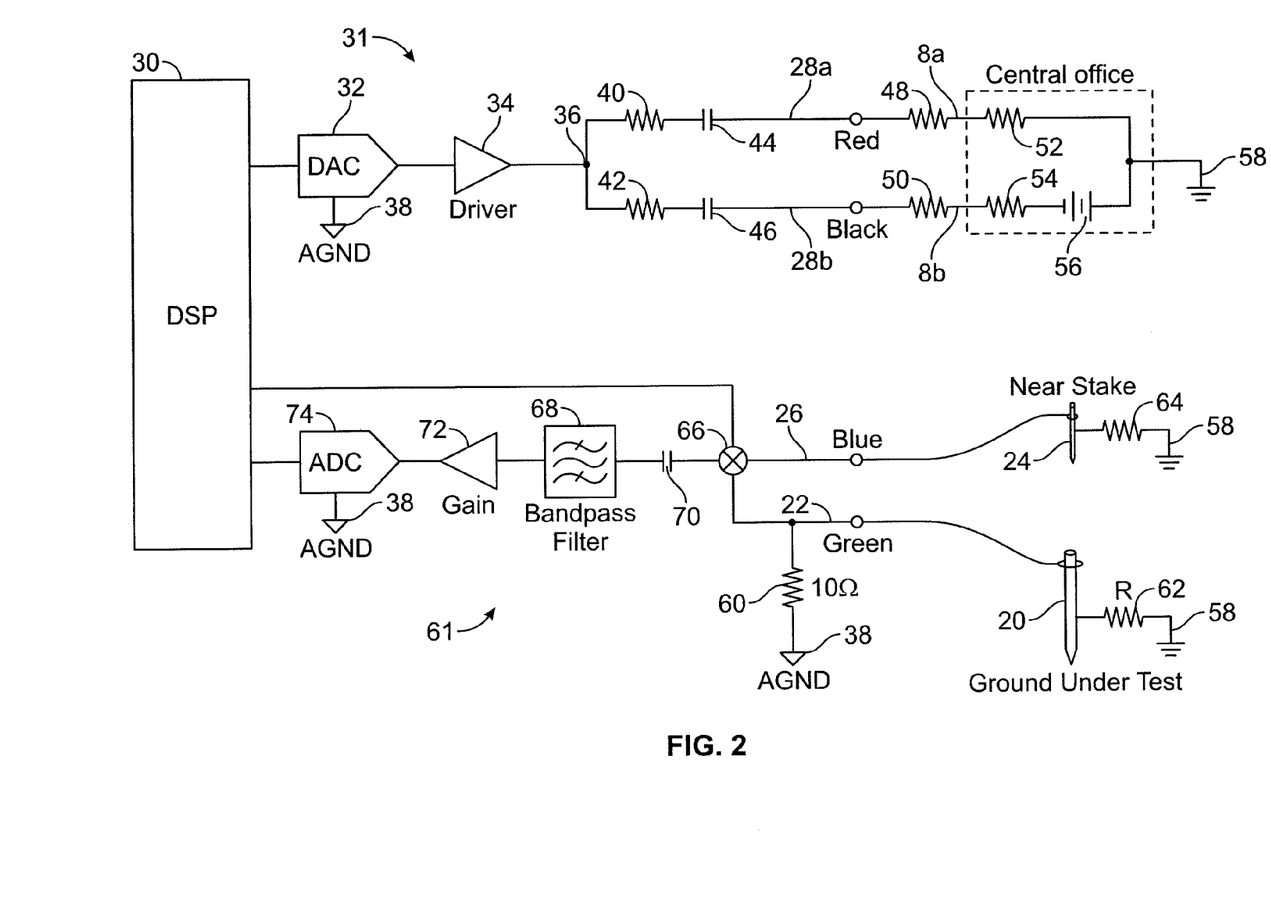
FIG. 2 illustrates further details of the ground resistance tester shown in FIG. 1.
Figure 3:
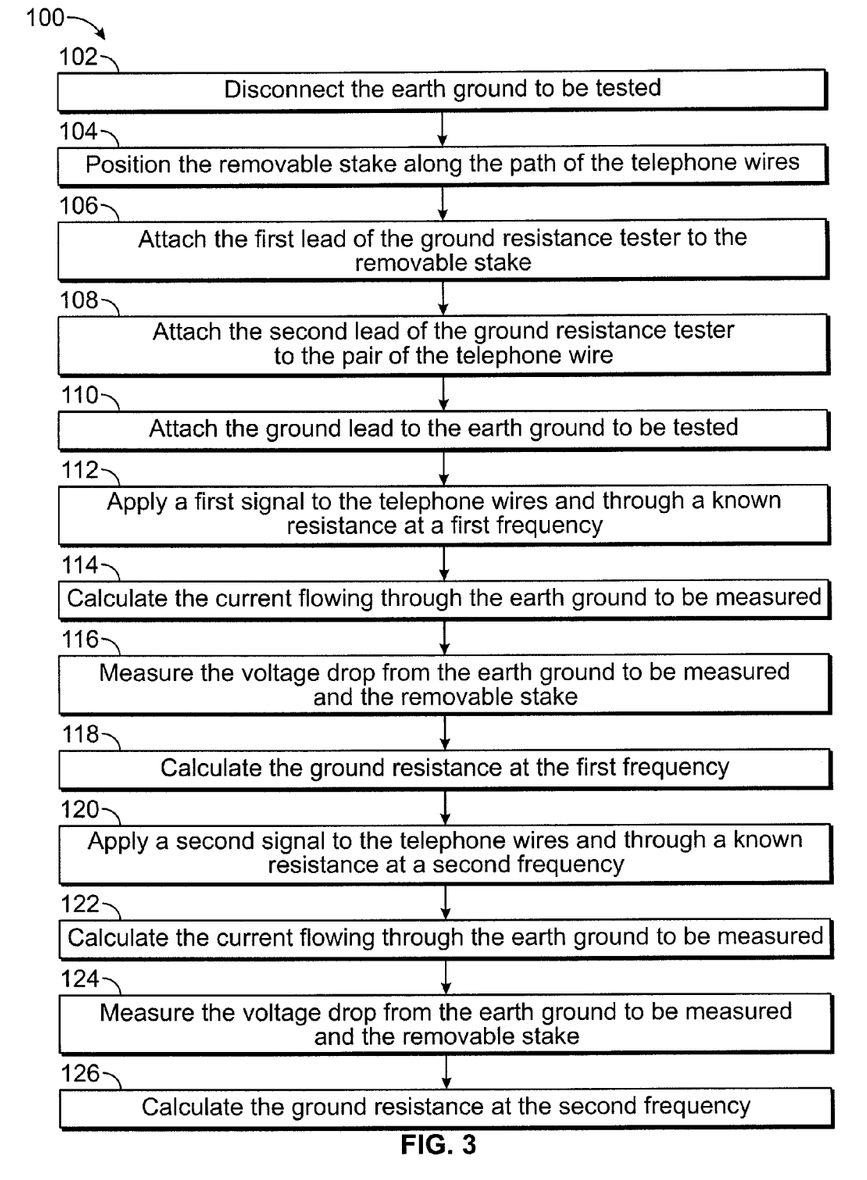
FIG. 3 is a flow chart illustrating the steps of the first method of the present invention.

The first method for measuring the ground resistance of an electrical system including a pair 8 of existing telephone wires by utilizing a ground resistance tester 10 is illustrated in FIGS. 1-3. The pair 8 of telephone wires is one of a plurality of pairs of telephone wires provided in a telephone cable (not shown). A shield (not shown) is also provided in the telephone cable. Connection of the ground resistance tester 10 in accordance with the first method of the present invention is illustrated in FIGS. 1 and 2 and the steps of the first method are illustrated in FIG. 3.

As illustrated in FIG. 1, the ground resistance tester 10 includes a housing 12, a display 14, controls 16 and a plurality of terminals 18. The earth ground 20 to be tested is connected to the ground resistance tester 10 through ground lead (green) 22. A first (near) stake 24 is positioned in the ground at a distance spaced from the earth ground 20. The first (near)

stake 24 is connected to the ground resistance tester through the first (near/blue) lead 26. The first stake 24 is positioned such that a line from the earth ground 20 to be tested to the first stake 24 runs in a direction aligned with the telephone cable.

Rather than placing a second (far) stake, the ground resistance tester 10 is connected to the pair of telephone wires 8 using the second (far) lead 28 of the ground resistance tester 10. The second (far) lead 28 includes a first (red) portion 28a and a second (black) portion 28b. The first portion 28a provides connection between the ground resistance tester 10 and a tip side 8a of the pair 8. The second portion 28b provides connection between the ground resistance tester 10 and the ring side 8b of the pair 8. Because the telephone wires 8a, 8b are connected to ground either at the central office or capacitively, the connection to the telephone wires 8a, 8b acts as a far stake which is sufficiently spaced from the earth ground 20 and the first (near) stake 24.

Details of the circuitry of the ground resistance tester 10 are shown in FIG. 2. As shown in FIG. 2, the ground resistance tester 10 includes a digital signal processor (DSP) 30 or other capable processor and generally includes a transmit section 31 and receiver section 61. The DSP 30 controls a digital to analog converter which is used to generate a stimulus tone used for the measurement. The tone generated by the digital to analog converter is driven by an amplifier circuit 34 in the transmit section 31 of the ground resistance tester 10. The tone output by the amplifier 24 is then split into a simplex or common mode signal at node 36 with respect to analog or circuit ground (AGND) 38. The simplex tone passes through a resistive output impedance 40, 42 and a capacitive output impedance 44, 46 to the first and second portions 28a, 28b of the far lead 28. The resistors 40, 42 provide a high enough impedance to prevent attenuation of any voice signals present across the first and second portions 28a, 28b of the far lead 28. The capacitors 44, 46 are present to protect the circuit from DC voltage and to prevent an active telephone line from being taken "off-hook". Resistors 48, 50 represent a simplified impedance of the telephone cable and resistors 52, 54 represent the impedance within the central office to the battery 56.

When considering AC currents, the impedance associated with DC voltage sources are considered negligible. Therefore, for purposes of the measurement to be made, the impedance from the red lead 28a to the earth ground 58 is the sum of the resistors 48 and 52 and the impedance from the black lead 28b to the earth ground 58 is the sum of the resistors 50 and 54. The predominant return path for the AC current transmitted through the transmit section 31 and the telephone wires 8a, 8b is the ground under test 20 and back to AGND 38 through the ground (green) test lead 22 and known reference resistor 60. The voltage created by the AC current passing through the ground resistance 62 is measured through the first (near) stake 24 and the connection to the first (near/blue) lead 26. The resistance 64 between the stake 24 and the earth ground 58 is negligible in the measurement as the input impedance of the receive section 61 is relatively high.

The AC Current flowing through the ground resistance under test 62 is measured as voltage across known reference resistor 60. The ground under test 20 is depicted as a stake but may in fact be any ground connection.

In the preferred embodiment, both the AC voltage measurement at stake 20 and the AC voltage measurement of the first (near) stake 24 are received through the same circuitry of the receive section 61. The measurement is selected through a switch or relay 66 controlled by the DSP 30. The receive section 61 includes a capacitor 70 a bandpass filter 68, an amplifier 72 and an analog to digital converter 74.

The signal received through the switch 66 is provided to a band pass filter 68 through a capacitor 70 and is passed to an amplifier 72 prior to conversion by the analog to digital converter (ADC) 74. Finally the converted signal is provided to the DSP 30.

FIG. 3 illustrates the steps of the first method 100 of the present invention. The first method 100 for measuring resistance of the earth ground 20 begins in the same manner as the existing methods by disconnecting the earth ground 20 to be tested from its existing connection(s) as represented at step 102. Next, the first (near) stake 24 is positioned in the ground at a distance spaced from the earth ground 20 to be tested, as represented at step 104. At step 106, the first (near) lead 26 is attached to the first (near) stake 24. Next at step 108, rather than placing a second (far) stake, the ground resistance tester 10 is connected to a pair 8 of telephone wires using a far lead 28 and connecting first portion 28a to the tip side 8a of the pair and second portion 28b to the ring side 8b of the pair. As represented at step 110, the ground lead 22 of the ground resistance tester 10 is attached to the earth ground 20 to be tested. Because the telephone wires 8a, 8b are connected to ground at either the central office or capacitively, the connection to the wires 8a, 8b of the telephone cable acts as a far stake which is sufficiently spaced from the earth ground 20 and the first stake 24. As shown at step 112, once all of the connections have been made, a simplex tone or signal at a first frequency is applied to the wires 8a, 8b of the telephone cable. This signal is sent through the pair 8 of telephone wires to earth ground 58. The signal is measured at the near stake 24 (see step 113) and through a known resistance 60 at the ground to be measured 20.(see step 115) At step 114, by utilizing the known resistance 60, the current flowing through the earth ground 20 is calculated. At step 116, the voltage drop between the first (near) stake 24 and the earth ground 20 to be tested is measured. At step 118, with the measured voltage drop, the resistance of the earth ground 62 can be calculated.

If it is desired to measure the ground resistance at an alternate frequency, steps 120-126 can be performed. With all of the above-described connections still in place, at step 120 a second signal at a second frequency is applied to the wires 8a, 8b of the telephone cable. This second signal is also applied to the known resistance of the ground resistance tester 10. At step 121 the voltage at the removable stake 24 is measured at a step 123 the voltage at earth ground is measured. At step 122, by utilizing the known resistance, the current flowing through the earth ground 20 is calculated. At step 124, the voltage drop between the first (near) stake 24 and the earth ground 20 to be tested is measured. At step 126, with the measured voltage drop, the resistance of the earth ground can be calculated.

Figure 4:
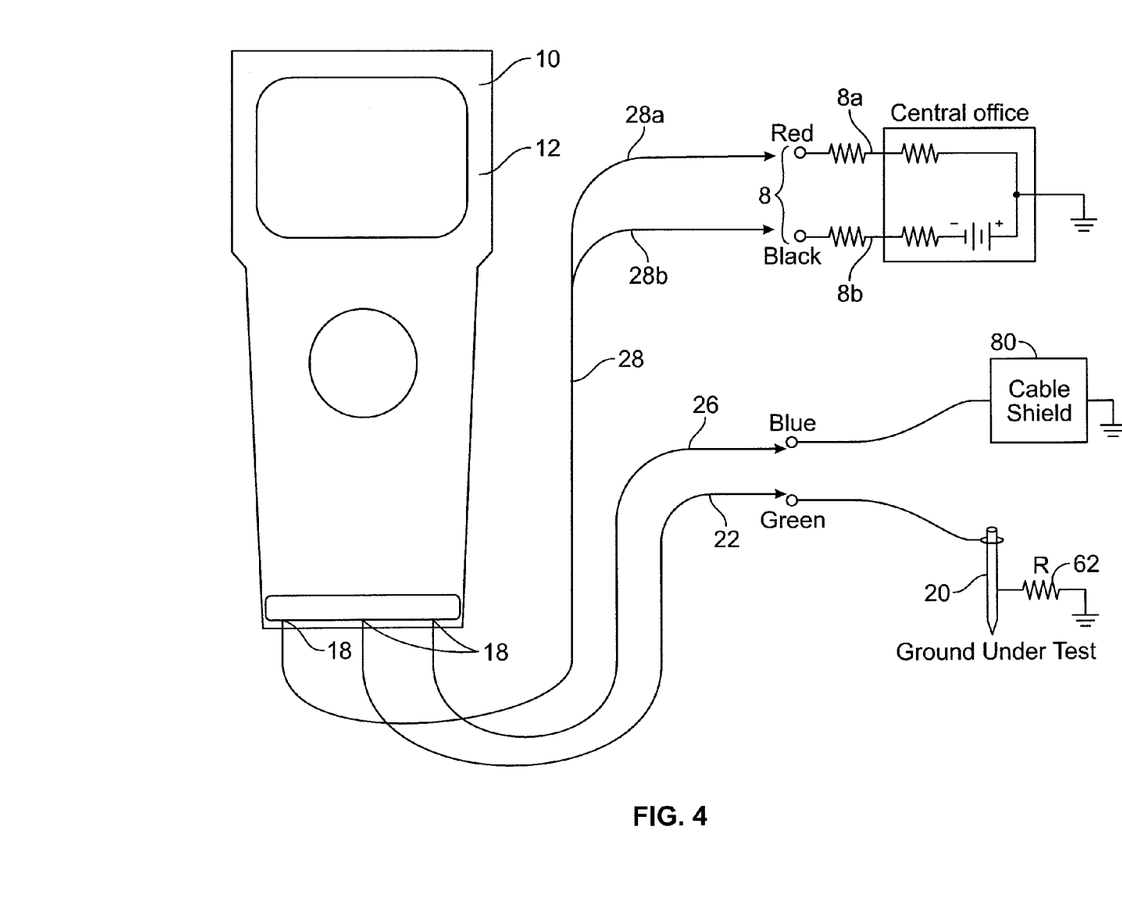
FIG. 4 illustrates connection of a ground resistance tester in accordance with a second method of the present invention.
Figure 5:
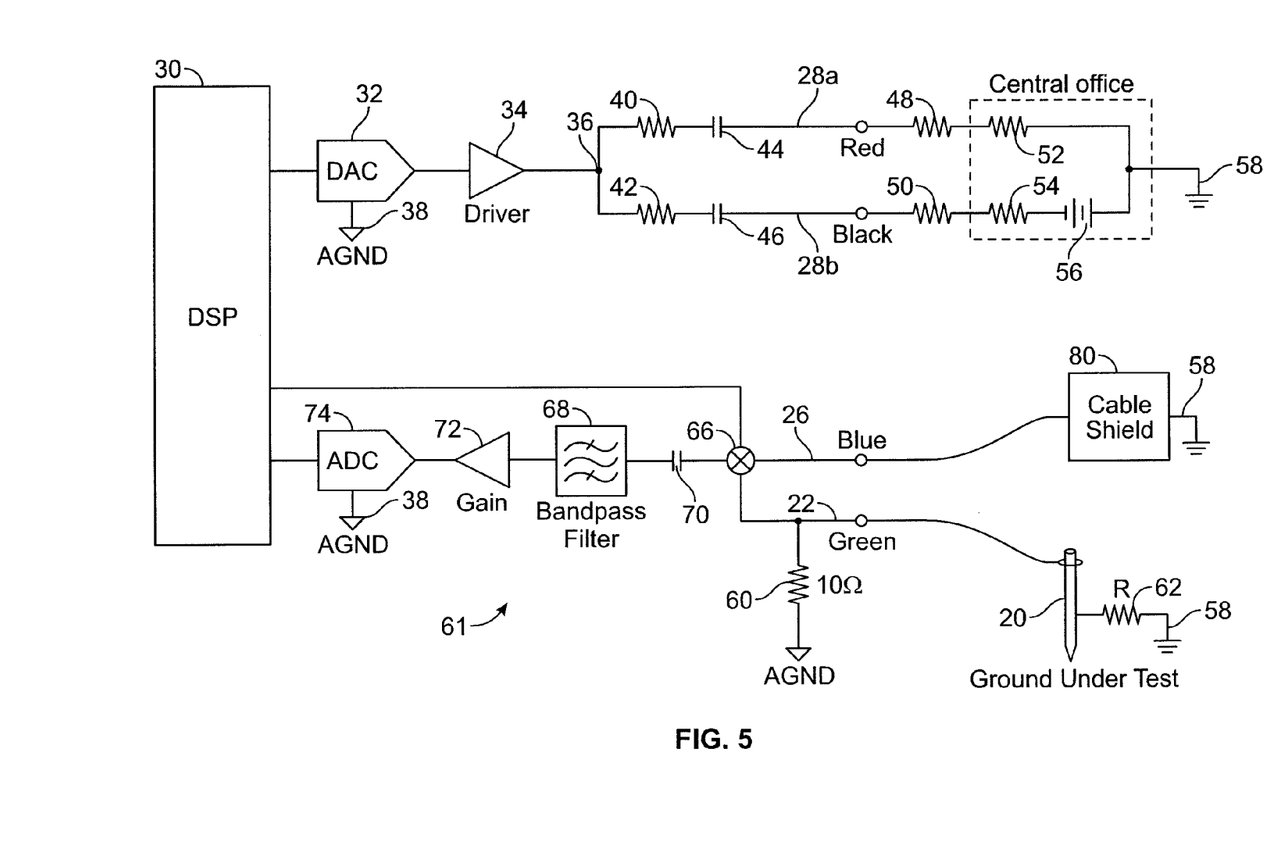
FIG. 5 illustrates further details of the ground resistance tester shown in FIG. 4.
Figure 6:
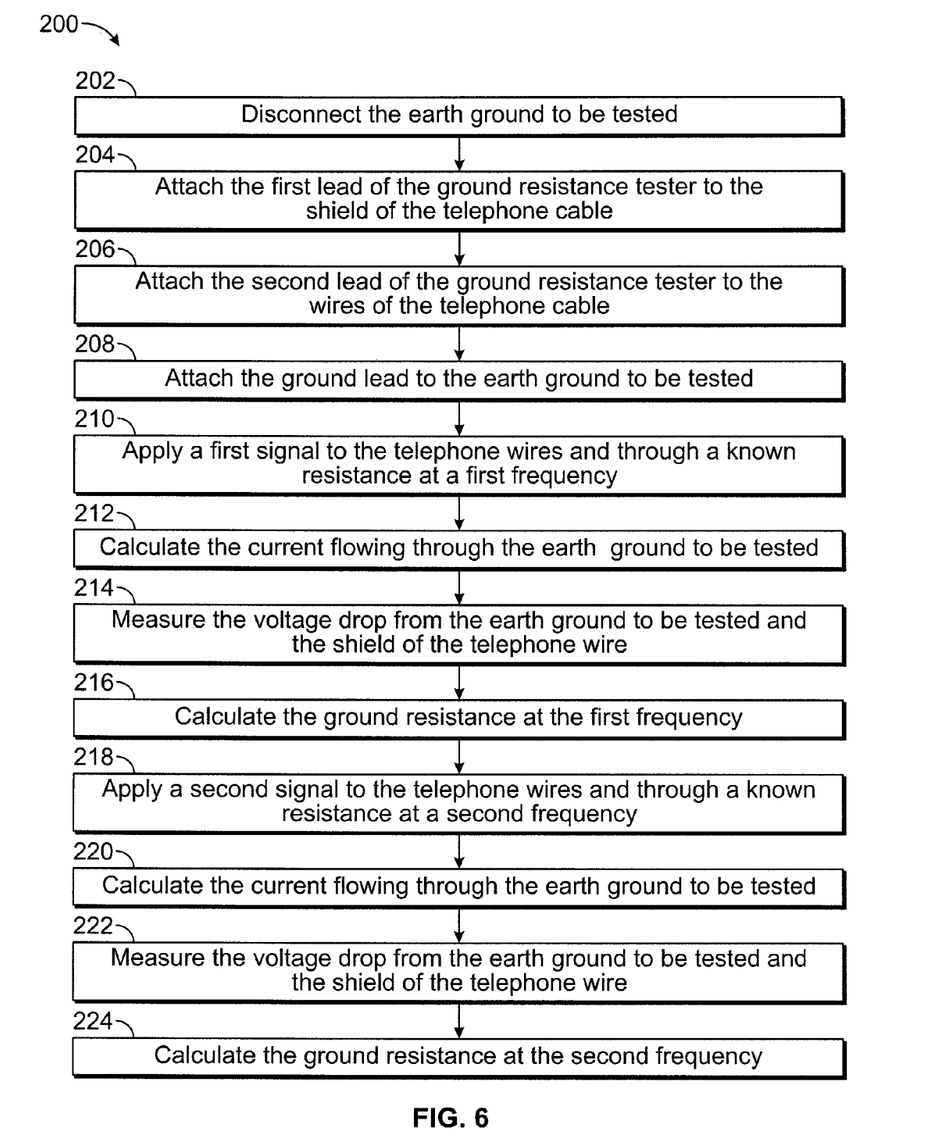
FIG. 6 is a flow chart illustrating the steps of the second method of the present invention.

The second method of measuring ground resistance of an electrical system including telephone wires 8a, 8b and an earth ground 20 is illustrated in FIGS. 4-6. Connection of the ground resistance tester 10 in accordance with the second method of the present invention is illustrated in FIGS. 4 and 5 and the steps of the second method are illustrated in FIG. 6.

As shown in FIGS. 4 and 5, the second method of measuring ground resistance is identical to the first method with the exception that use of the first (near) stake 24 has been eliminated. Rather than attaching the first (near) lead 26 to removable stake 24, the first (near) lead 26 of the earth ground tester 10 is it attached to the telephone cable shield which surrounds the telephone wires 8a, 8b of the telephone cable. The telephone cable shield is represented in FIG. 4 at 80. The telephone cable shield 80 is assumed to have an earth connection at one or more points along the telephone cable and therefore the connection of this first (near) lead 26 acts as the "near stake" for the "fall of potential method". As with the first method described above, rather than placing a second (far) stake, the ground resistance tester 10 is connected to the telephone wires 8a, 8b using the second (far) lead 28 of the ground resistance tester 10. Because the telephone wires 8a, 8b are connected to ground at the central office or capacitively, the connection to the telephone lines 8a, 8b acts as a "far stake" which is sufficiently spaced from the earth ground 20 and the grounded telephone cable shield 80 or "near stake".

FIG. 6 illustrates the second method 200 of the present invention. The second method 200 for measuring resistance of an earth ground 20 begins in the same manner as the existing methods by disconnecting the earth ground 20 to be tested from its existing connection(s) as represented at step 202. Next at step 204, the first (near/blue) lead 26 is attached to the shield 80 of the telephone cable. At step 206, the ground resistance tester 10 is connected to the telephone wires 8a, 8b using a second (far) lead 28 (black and red) of the ground resistance tester 10. As represented at step 208, the ground lead 22 (green) of the ground resistance tester 10 is attached to the earth ground 20 to be tested. Because the telephone wires 8a, 8b are connected to ground either at the central office or capacitively, the connection to the wires 8a, 8b of the telephone cable acts as a far stake which is sufficiently spaced from the earth ground 20 and the connection to the near lead connection at the telephone shield 80. As shown at step 210, once all of the connections have been made, a simplex tone or signal at a first frequency is applied to the telephone wires 8a, 8b of the telephone cable This signal is sent through the pair 8 of telephone wires to earth ground 58. The signal is measured at the cable shield 80 (see step 209) and through a known resistance 60 at the ground to be measured 20 (see step 211). At step 212, by utilizing the known resistance, the current flowing through the earth ground 20 is calculated. At step 214, the voltage drop between the first (near) connection at the shield 80 and the earth ground 20 to be tested is measured. At step 216, with the measured voltage drop, the resistance of the earth ground 62 can be calculated.

If it is desired to measure the ground resistance at an alternate frequency, steps 218-224 can be performed. With all of the above-described connections still in place, at step 218 a second signal at a second frequency is applied to the wires 8a, 8b of the telephone cable. This second signal is also applied to the known resistance of the ground resistance tester 10. At step 217 the voltage at the cable shield 80 is measured and at step 219 the voltage at the earth ground 20 is measured. At step 220, by utilizing the known resistance, the current flowing through the earth ground is calculated. At step 222, the voltage drop between the first (near) connection at the shield 80 and the earth ground 40 to be tested is measured. At step 224, with the measured voltage drop, the resistance of the earth ground can be calculated.

As described above, each method provides for the application of a simplex tone or signal to the telephone wires 8a, 8b. In this context, a simplex tone means stimulating both wires 8a, 8b of the pair with a signal that is the same in amplitude and phase. The tone is sent with respect to circuit ground (AGND) 38 of the ground tester 10. By providing signals which are the same in amplitude and phase on each wire 8a, 8b of the pair, service on the telephone line used for testing will not be interrupted or impaired.

Although connection to each of the wires 8a, 8b of a pair 8 of wires has been shown and described for the purpose of providing a "far stake" by connecting both first and second portions 28a, 28b of the second (far) lead 28 to the wires 8a, 8b, it is to be understood that connection of the "far stake" can be made by connecting only one of the first or second portions 28a, 28b of the second (far) lead 28 to one of the wires 8a, 8b.

In addition as described above, the invention is enhanced by transmitting the simplex tones or signals at a variety of frequencies. By transmitting the tones at a variety of frequencies, the earth ground resistance can be determined and evaluated for low as well as high frequency signals paths.

The method of the present invention is further enhanced by filtering power line signals or power harmonics to prevent false indications.

While preferred embodiments of the present invention are shown and described, it is envisioned that those skilled in the art may devise various modifications of the present invention without departing from the spirit and scope of the appended claims.

The invention claimed is:

1. A method of measuring ground resistance of an earth ground in communication with a telephone cable having a plurality of pairs of telephone wires, the method comprising the steps of:
   providing a ground resistance tester having a first lead, a second lead including first and second connectors, and a ground lead;
   providing a removable stake;
   positioning the removable stake in the ground, spaced from the earth ground to be tested;
   attaching said first lead to said removable stake;
   attaching said first connector of said second lead to the tip of a pair and said second connector of said second lead to the ring of the pair;
   attaching said ground lead to the earth ground to be tested;
   providing a signal to said pair;
   measuring a voltage at said removable stake;
   measuring a voltage at said earth ground to be tested;
   determining the current of said signal flowing through a known resistance;
   calculating the drop in voltage between said earth ground to be tested and said removable stake;
   calculating the resistance of the earth ground based upon the calculated drop in voltage and the determined current.

2. The method of measuring ground resistance as defined in claim 1, wherein the step of providing a signal includes providing a signal having the same amplitude and phase to each wire of the pair.

3. The method of measuring ground resistance as defined in claim 2, wherein said pair of telephone wires is active and service on said telephone wires is not interrupted.

4. The method of measuring ground resistance as defined in claim 1, wherein said step of measuring a voltage at said removable stake further includes the step of filtering power line signals.

5. The method of measuring ground resistance as defined in claim 4, wherein said step of filtering is provided by a digital filter.

6. The method of measuring ground resistance as defined in claim 1 wherein said step of providing said signal further includes providing signals at multiple frequencies and wherein said step of calculating the resistance of said earth ground is performed for each signal provided.

7. A method of measuring ground resistance of an earth ground in electrical communication with a telephone cable having a plurality of pairs and a shield, the method comprising the steps of:
   providing a ground resistance tester having a first lead, a second lead having first and second connector, and a ground lead;

disconnecting the shield of the telephone cable from its existing connections;

attaching said first lead to the shield of the telephone cable;

attaching said first connector of said second lead to a tip of a pair and the second connector of said second lead to a ring of the pair;

attaching said ground lead to the earth ground to be tested;

providing a signal to said telephone pair;

measuring a voltage at the shield;

measuring a voltage at said earth ground to be tested;

determining the current of said signal flowing through a known resistance;

calculating the drop in voltage between said earth ground to be tested and the shield;

calculating the resistance of the earth ground based upon the calculated drop in voltage and the determined current.

8. The method of measuring ground resistance as defined in claim 7, wherein the step of providing a signal includes providing a signal having the same amplitude and phase to each wire of the pair.

9. The method of measuring ground resistance as defined in claim 8, wherein said pair is active and service on said telephone wires is not interrupted.

10. The method of measuring ground resistance as defined in claim 7, wherein said step of measuring voltage at the shield further includes the step of filtering power line signals.

11. The method of measuring ground resistance as defined in claim 10, wherein said step of filtering is provided by a digital filter.

12. The method of measuring ground resistance as defined in claim 7 wherein said step of providing said signal further includes providing signals at multiple frequencies and wherein said step of calculating the resistance of said earth ground is performed for each signal provided.

* * * * *